United States Patent
Gardner et al.

[19]

[11] Patent Number: 6,091,105
[45] Date of Patent: Jul. 18, 2000

[54] METHOD OF MAKING A SELF-ALIGNED DOPANT ENHANCED RTA MOSFET

[75] Inventors: Mark I. Gardner, Cedar Creek; H. Jim Fulford, Austin, both of Tex.

[73] Assignee: Advanced Micro Devices, Inc., Sunnyvale, Calif.

[21] Appl. No.: 09/050,753

[22] Filed: Mar. 30, 1998

[51] Int. Cl.[7] .................................................. H01L 29/72
[52] U.S. Cl. .......................................... 257/329; 257/330
[58] Field of Search .................................... 257/329, 330

[56] References Cited

U.S. PATENT DOCUMENTS 5,721,442  2/1998  Hong ........................................ 257/330

OTHER PUBLICATIONS

Stanley Wolf and Richard N. Tauber *Silicon Processing for the VLSI Era, Vol. 1: Process Technology*, pp. 555–579, 1986.

Stanley Wolf and Richard N. Tauber, *Silicon Processing for the VLSI Era, vol. 2: Process Integration*, pp. 327–335, 493–496, 1990.

Primary Examiner—Edward Wojciechowicz
Attorney, Agent, or Firm—Timothy M. Honeycutt

[57] ABSTRACT

An integrated circuit and a method of fabricating the same in a substrate are provided. A trench is formed in the substrate. The trench has a sidewall. A first insulating layer is formed on the sidewall. A gate electrode is formed on the first insulating layer. A first source/drain region is formed in the substrate and a second source/drain region is formed in the substrate. A first portion of the first source/drain region and a second portion of the second source/drain region are vertically spaced apart to define a channel region in the substrate. The process enables channel lengths to be set independent of the maximum resolution of the photolithographic system used to pattern the wafer. Very short channel lengths may be implemented.

24 Claims, 3 Drawing Sheets

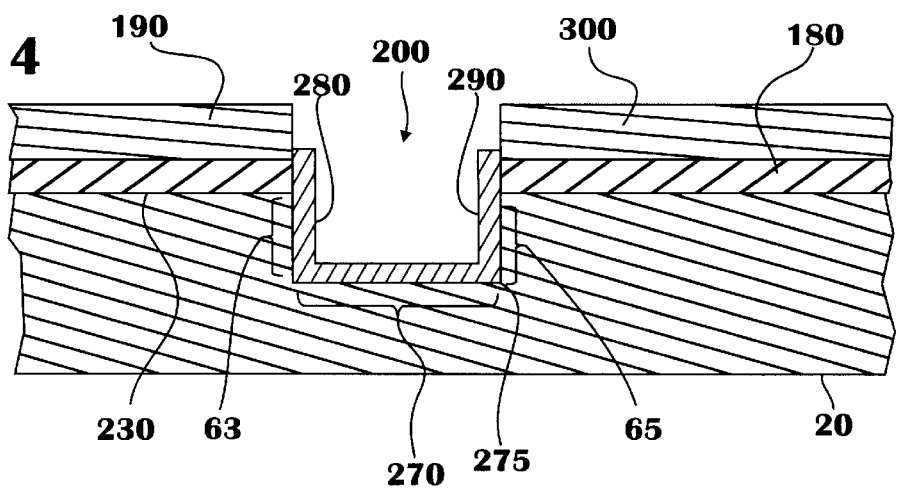
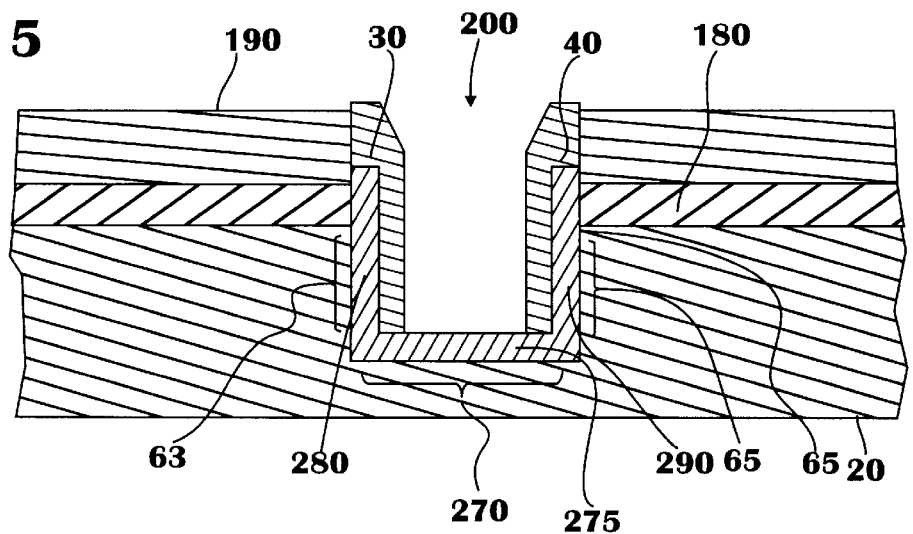
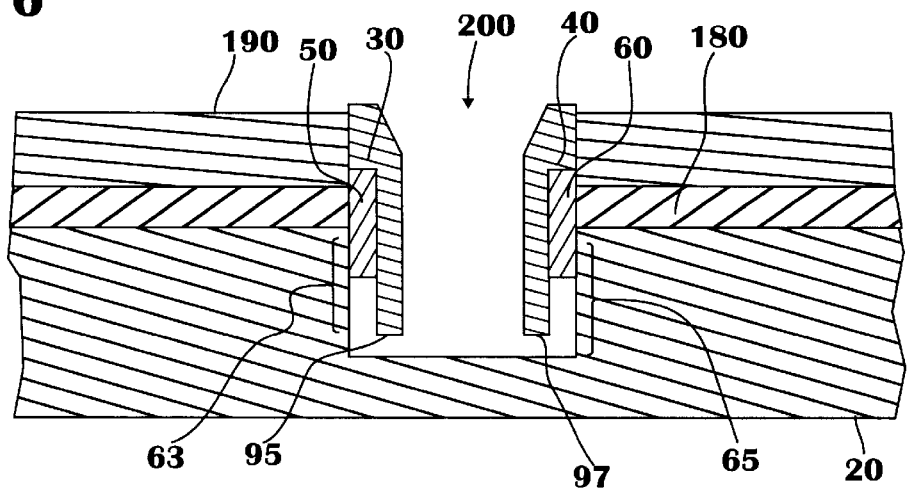

METHOD OF MAKING A SELF-ALIGNED DOPANT ENHANCED RTA MOSFET

BACKGROUND OF THE INVENTION

1. Field of the Invention

This invention relates generally to semiconductor processing, and more particularly, to a method of fabricating an integrated circuit transistor with a diffused source/drain region vertically separated from another source/drain region.

2. Description of the Related Art

Insulated gate field effect transistors ("IGFET"), such as metal oxide semiconductor field effect transistors ("MOSFET"), are some of the most commonly used electronic components in modern integrated circuits. Embedded controllers, microprocessors, analog-to-digital converters, and many other types of devices now routinely include millions of MOSFETs. The dramatic proliferation of MOSFETs in integrated circuit design can be traced to their high switching speeds, potentially low power dissipation, and adaptability to semiconductor process scaling.

A typical MOSFET implemented in silicon consists of a source and a drain formed in a silicon substrate, and separated laterally to define a channel region in the substrate. A gate electrode composed of a conducting material, such as aluminum or polysilicon, is disposed over the channel region and designed to emit an electric field into the channel region. Changes in the electric field emitted by the gate electrode enable, or alternatively, disable the flow of current between the source and the drain.

In a conventional process flow for forming a typical MOSFET, a gate oxide layer is grown on a lightly doped silicon substrate and a layer of polysilicon is deposited on the gate oxide layer. The polysilicon and the gate oxide are then lithographically patterned and anisotropically etched back to the upper surface of the substrate leaving a gate electrode stack consisting of a polysilicon gate electrode stacked on top of a gate oxide layer. Following formation of the gate electrode stack, a source and a drain are formed by implanting a dopant species into the substrate. The gate electrode stack acts as a hard mask against the implant so that the source and drain are formed in the substrate self-aligned to the gate electrode stack.

In conventional processing, the gate oxide layer and electrode are formed on the semiconductor wafer in a generally parallel orientation relative to the horizontal plane of the wafer. The source and drain are formed on opposite sides of the gate electrode stack with the lateral spacing between the source and the drain defining a channel region for the MOSFET. In conjunction with several other factors, the width of the channel region or "channel length" determines the ultimate speed of the MOSFET. As a general rule of thumb, smaller channel widths translate into both higher switching speeds and smaller die areas.

The minimum channel length attainable in conventional processing is dictated, in large part, by the width of the gate oxide layer and the gate electrode. As with other horizontal dimensions on a given wafer, the minimum achievable width of the gate oxide layer and gate electrode is determined by the resolution of the photolithographic system used to pattern the wafer. The resolution of an optical photolithographic system is normally an aggregate of a number of physical mechanisms, such as lens aberrations, light spectrum, and diffraction effects. However, diffraction effects constitute the dominant limitation to resolution, particularly in sub 1.0 µm processing.

The fabrication of increasingly smaller features such as gate electrode stacks relies on the availability of increasingly higher resolution optical lithography equipment. Designers of optical lithography equipment have employed several techniques to combat the deleterious effects of light diffraction. Some of these techniques include decreasing the wave length of the illuminating light, increasing the numerical aperture of the system, increasing the contrast of the resist by modifying resist chemistry or by creating entirely new resists, and adjusting the coherence of the optical system. Even with the availability of these various techniques for increasing the resolution of optical lithography equipment, the best of conventional optical lithography systems have a resolution limit of about 0.2 µm.

Electron beam lithography has occasionally been used as a substitute for optical lithography in circumstances where the resolution limits of the prevailing optical lithography techniques prevented successful fabrication of a particular integrated circuit. However, there are several drawbacks associated with electron beam lithography, including resolution limitations associated with electrons forward scattered in the resist and back scattered from the substrate, swelling, which often occurs during development of a negative e-beam resist, extremely slow processing times when compared to optical projection systems, and significantly higher cost of electron beam lithography systems compared to optical steppers.

X-ray lithography has also been used occasionally in place of optical lithography to obtain resolutions in the sub 1 µm area. However, as with electron beam lithography, certain technical difficulties have prevented X-ray lithography from supplanting optical lithography as the lithographic process of choice in mass produced integrated circuits. X-ray reticles have proven to be extremely difficult to reliably manufacture.

The present invention is directed to overcoming or reducing one or more of the foregoing disadvantages.

SUMMARY OF THE INVENTION

In accordance with one aspect of the present invention, a method of fabricating an integrated circuit transistor on a substrate is provided. The method includes the step of forming a trench in the substrate. The trench has a sidewall. A first insulating layer is formed on the sidewall. A gate electrode is formed on the first insulating layer and has a lower end. A first source/drain region is formed in the substrate above the lower end of the gate electrode. A second source/drain region is formed in the substrate whereby a first portion of the first source/drain region and a second portion of the second source/drain region are vertically spaced apart to define a channel region in the substrate and the second portion of the second source/drain region has a junction positioned substantially at or above the lower end of the gate electrode.

In accordance with another aspect of the present invention, a method of fabricating an integrated circuit transistor on a substrate is provided. The method includes the step of forming a trench in the substrate. The trench has a sidewall. A first insulating layer is formed in the trench and coats the sidewall. A gate electrode is formed on the first insulating layer and has a lower end. A first portion of the first insulating layer is removed while a second portion thereof is left between the gate electrode and the sidewall. A first source/drain region is formed in the substrate whereby the first source/drain region has a first portion disposed laterally in relation to the first insulating layer and has a junction positioned substantially at or above the lower end of the gate electrode. A second source/drain region is formed in the substrate above the lower end of the gate electrode whereby a first portion of the first source/drain region and a second portion of the second source/drain region are vertically spaced apart to define a channel region in the substrate.

In accordance with still another aspect of the present invention, an integrated circuit transistor is provided. The transistor includes a substrate that has a trench formed therein. The trench has a sidewall. A first insulating layer is coupled to the sidewall. There is a first source/drain region in the substrate. The first source/drain region has a first portion that is laterally disposed in relation to the first insulating layer. A second source/drain region is provided in the substrate and has an upwardly projecting portion with a junction. The upwardly projecting portion is vertically spaced from the first source/drain region to define a channel region lateral to the first insulating layer. A gate electrode is coupled to the gate dielectric layer. The gate electrode is spaced laterally from the first and second source/drain regions by the first insulating layer and has a lower end positioned substantially at or below the junction.

BRIEF DESCRIPTION OF THE DRAWINGS

The foregoing and other advantages of the invention will become apparent upon reading the following detailed description and upon reference to the drawings in which:

FIG. 4 is the cross-sectional view of FIG. 3 following formation of a gate dielectric layer and deposition of a conductor layer in accordance with the present invention;

FIG. 5 is the cross-section view of FIG. 4 following definition of first and second gate electrodes in accordance with the present invention;

FIG. 6 is the cross-sectional view of FIG. 5 depicting removal of a portion of the gate dielectric layer in accordance with the present invention;

DETAILED DESCRIPTION OF SPECIFIC EMBODIMENTS

Figure 1:
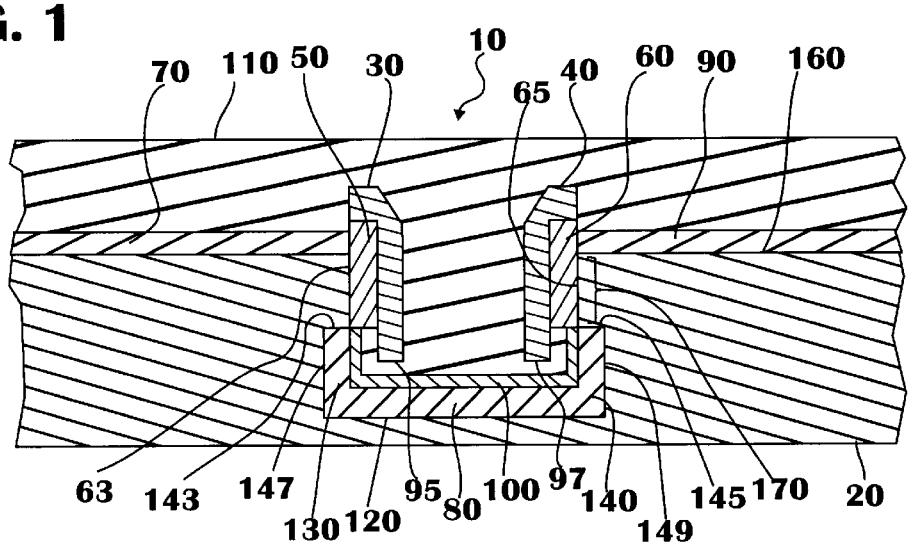
FIG. 1 is a cross-sectional view of an exemplary embodiment of an integrated circuit transistor fabricated in accordance with the present invention.

In the drawings described below, reference numerals are generally repeated where identical elements appear in more than one figure. Turning now to the drawings, and in particular to FIG. 1, there is shown an exemplary embodiment of an integrated circuit transistor 10 in accordance with the present invention. The transistor 10 may be an IGFET, a MOSFET, or other type of transistor and may be n-channel or p-channel. For the purpose of illustration, the transistor 10 and the process of performing the same will be described in the context of a n-channel transistor. The transistor 10 is formed on a semiconductor substrate 20, which may be composed of n-doped or p-doped silicon, silicon-on-insulator, or other suitable substrate materials. The transistor 10 includes first and second gate electrodes 30 and 40 formed on respective first and second insulating or gate dielectric layers 50 and 60. The layers 50 and 60 are formed on respective sidewalls 63 and 65 of the substrate 20. First, second, and third source/drain regions 70, 80, and 90 are provided. The phrase "source/drain region(s)" is used herein to describe a region that may serve as either a source or a drain. The skilled artisan will appreciate that a source/drain region may function as a source or a drain depending upon whether it is connected to $V_{SS}$ or $V_{DD}$ during metallization. The gate electrodes 30 and 40 have respective lower ends 95 and 97 projecting down into the substrate 20. The source/drain regions 70, 80, and 90 are formed in the substrate 20. A protective insulating layer 100 composed of silicon dioxide or other suitable dielectric materials is formed over the source/drain region 80. The transistor 10 is coated with a passivation layer 110, which covers the source/drain regions 70 and 90 and fills the void between the gate electrodes 30 and 40.

The transistor 10 may consist of a variety of combinations of the gate electrodes 30 and 40, and the source/drain regions 70, 80, and 90. For example, the transistor 10 may consist of the gate electrode 40 coupled to a voltage source and used in conjunction with the source/drain region 80 and the source/drain region 90 with the gate electrode 30 unconnected to power, ground, or other components. Conversely, the gate electrode 40 may be left inactive and the gate electrode 30 may be connected to a voltage source and used in conjunction with the source/drain region 80 and the source/drain region 70. In the following discussion, the gate electrode 40 is coupled to a suitable voltage source and combined with the source/drain region 80 and the source/drain region 90 to make up the transistor 10. However, the description of the structure and function of the gate electrode 40, the interaction of the source/drain region 80 and 90, and the gate dielectric layer 60 is exemplary of the structure and function of the gate electrode 30, the gate dielectric layer 50, and the interaction of the source/drain region 70 and the source/drain region 80.

In contrast to a conventional semiconductor transistor, the gate electrode 40 and the layer 60 in the transistor 10 are disposed in a relatively upright orientation relative to the horizontal plane of the substrate 20. The vertical orientation of the gate electrode and the layer 60 are dictated by the vertical orientation of the sidewall 65. It is anticipated that the sidewalls 63 and 65, and thus the gate electrode 40 and gate dielectric layer 60, may be disposed in a slanted orientation relative to the horizontal plane. A slanted arrangement may consume additional substrate surface area. The source/drain region 80 includes a generally horizontal portion 120 and upwardly projecting and spaced apart portions 130 and 140. The portions 130 and 140 include respective horizontal junctions 143 and 145 and vertical junctions 147 and 149. The portion 140 is disposed in the substrate 20 lateral to the gate dielectric layer 60. The vertical spacing between the junction 145 of the portion 140 and the junction 160 of the source/drain region 90 defines a channel region 170 in the substrate 20 separated from the gate electrode 40 by the layer 60.

Figure 2:
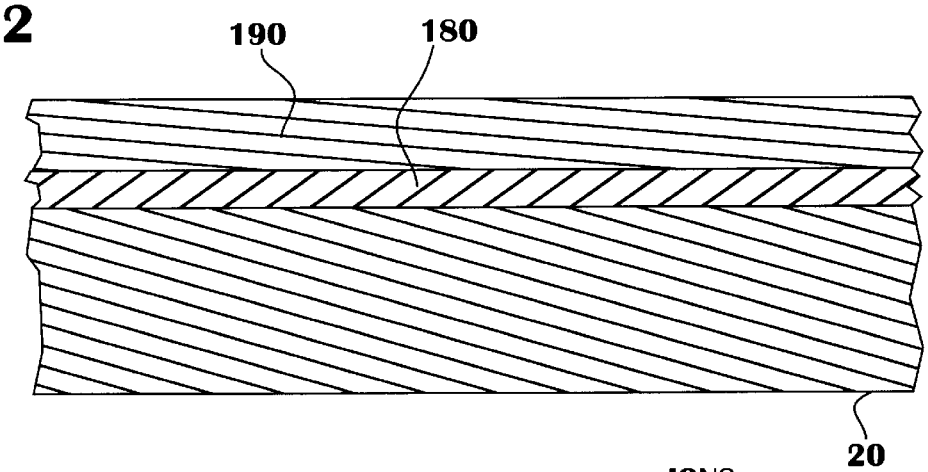
FIG. 2 is a cross-sectional view of a substrate and depicts formation of a pad oxide and a nitride layer in accordance with the present invention.

An exemplary process flow for forming the transistor 10 shown in FIG. 1 may be understood by referring now to FIGS. 2, 3, 4, 5, 6, 7, and 8, and initially to FIG. 2. A third insulating or pad oxide layer 180 is formed on the substrate 20 and a fourth insulating or silicon nitride layer 190 is formed on the pad oxide layer 180. As described more below, the pad oxide layer 180 and the nitride layer 190 protect the substrate 20 from various etching, deposition, and doping steps performed later in the process flow. The pad oxide layer 180 may be formed by thermal oxidation of the substrate 20 by exposing the substrate 20 to an oxygen containing ambient, such as $O_2$, at approximately 850 to 1050° C. for 30 seconds in a rapid thermal anneal (RTA) process or a suitable diffusion tube process at the same temperature range for about 10 to 30 minutes, or by well known chemical vapor deposition (CVD) techniques. The pad oxide layer 180 may be about 50 to 200 Å thick and is advantageously about 125 Å thick. The nitride layer 190 may be formed by well known low pressure CVD techniques or other suitable nitride formation techniques. The nitride layer 190 may be about 600 to 1800 Å thick and is advantageously about 1200 Å thick.

Figure 3:
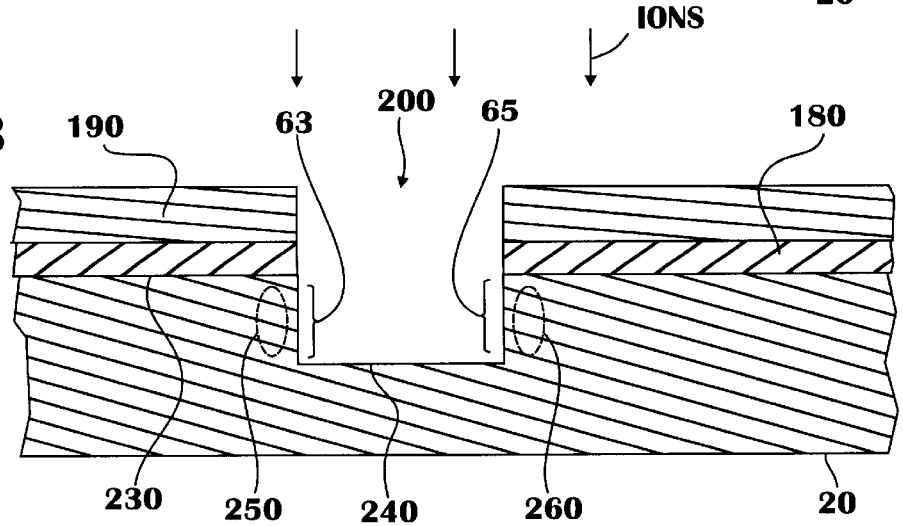
FIG. 3 is the cross-sectional view of FIG. 2 depicting formation of a trench in the substrate in accordance with the present invention.

Referring now to FIG. 3, a trench 200 is formed through the nitride layer 190, the pad oxide layer 180 and into the substrate 20 by anisotropic etching. The etch may be by reactive ion etching, or other suitable anisotropic etching techniques. The trench 200 is formed such that at least one sidewall, such as 65, is defined. As depicted, the trench 200 includes two opposing sidewalls 63 and 65. The sidewall 65 is preferably substantially vertical, but may also be slanted. The depth of the trench 200 from the interface 230 between the pad oxide layer 180 and the substrate 20 and the bottom 240 of the trench 200 plays a significant role in determining the ultimate channel length of the transistor 10 shown in FIG. 1, and as such, is largely a matter of design discretion. In an exemplary embodiment, the trench depth may be 0.03 to 0.2 $\mu$m and is advantageously about 0.05 $\mu$m.

An implant to control threshold voltage may be performed. Prior to the implant, the nitride layer 190 and the trench 200 are masked and patterned so that the ion implantation establishes dopant profiles in the regions lateral to the sidewalls 210 and 220 as represented by the dashed ovals 250 and 260. The implant is advantageously tailored to position the peak concentration of dopant approximately at the midpoint between the interface 230 and the bottom 240 of the trench 200. In an exemplary embodiment for an enhancement mode device, boron may be implanted with an energy of about 30 to 200 keV and advantageously about 100 keV. The dosage may be about 1E12 to 5E12 ions/cm² and is advantageously about 3E12 ions/cm². If the pad oxide layer 180 and the nitride layer 190 are not present at the time of the implant, the energy may be about 5 to 20 keV and advantageously about 10 keV. If the device is to be implemented as a depletion mode device, n-type dopants may be used. The skilled artisan will appreciate that the dosage and energy for n-type dopants will be proportional to the above referenced parameters based on mass.

Referring now to FIG. 4, a gate dielectric layer 270 is formed in the trench 200. The layer consists of a lower portion 275 and two spaced apart upwardly projecting portions 280 and 290. The bottom portion 275 and some of the portions 280 and 290 will be subsequently etched to yield the separate gate dielectric layers 50 and 60 shown in FIG. 1. The layer 270 is advantageously composed of $SiO_2$, or other suitable gate oxide material. If $SiO_2$ is selected, the layer 270 may be grown by exposing the substrate 20 to an $O_2$ containing ambient at approximately 800 to 1050° C. for approximately 10 to 60 seconds in a rapid thermal anneal process ("RTA"), or for approximately 5 to 20 minutes in a diffusion tube process. A nitrogen bearing species, such as NO or $N_2O$, may be added to the ambient to infuse nitrogen into the layer 190 to inhibit polysilicon depletion if the transistor is implemented as p-channel, and reduce hot carrier effects. The gate dielectric layer 270 may have a thickness of about 20 to 40 Å and advantageously about 30 Å. It is anticipated that the crystal plane orientation of the substrate 20 at the sidewall 65 will yield a slightly higher oxide reaction rate than the crystal plane orientation of the bottom 240 of the trench 200. Accordingly, it is anticipated that the vertically disposed portions 280 and 290 of the layer 270 will be approximately 3 to 5% thicker than the portion formed in the bottom 240 of the trench 200.

Following formation of the layer 270, a conductor layer 300 is formed over the nitride layer and in the trench 200 coating the layer 270. Through subsequent masking and etching, the conductor layer 300 will be transformed into the gate electrodes 30 and 40. Accordingly, the conductor layer 300 is advantageously composed of a variety of conducting materials, such as, for example, amorphous silicon or polysilicon. In an exemplary embodiment, the conductor layer 300 is composed of polysilicon. Well known techniques for applying polysilicon, such as CVD, may be used to deposit the conductor layer 300. In an exemplary embodiment, the conductor layer 300 is deposited so that the portion of the layer formed on the portions 280 and 290 of the dielectric layer 270 has a thickness of about 500 and 2000 Å and advantageously about 1000 Å.

Referring now to FIG. 5, the conductor layer 300 is masked and anisotropically etched to yield the gate electrodes 30 and 40. Note that the portion of the conductor layer in the bottom 240 of the trench 200 is removed to expose the upper surface of the layer 270. The etching may be accomplished by reactive ion or plasma etching.

Referring now to FIG. 6, the gate dielectric layers 50 and 60 are fully defined by removing the portion 275 and some of the portions 280 and 290 of the layer 270 shown in FIG. 5. The various portions are advantageously removed by etching. The etch may be a wet etch in HF in a 10 to 1 solution, a BOE etch, or other suitable etching technique. The ultimate height, and therefore the ultimate length of the channel 170 for the transistor 10 shown in FIG. 1 will be determined by the amount of the vertical portions 280 and 290 removed during the etching process. The ultimate goal of the etching step is to expose enough of the sidewall 65 so that the upwardly projecting portion 140 of the source/drain region 80 (See FIG. 1) may be formed with the junction 150 thereof appropriately positioned vertically relative to the gate electrode 40 for proper electrical performance. The skilled artisan will appreciate that if the junction 150 is disposed substantially below the gate electrode 40 in the vertical direction, the result may be poor electrical performance. Accordingly, it is desirable for enough of the vertical portion 290 to be removed so that the junction 150 of the source/drain region 80 is positioned approximately at or above the lower end 97 of the gate electrode 40.

It is anticipated that conventional end point detection techniques may not reliably predict the desired end point for the etching step. Accordingly, the etch to establish the layers 50 and 60 is advantageously a timed etch. The duration of the etch may be determined by taking into account the anticipated removal rate for the particular etchant solution. For example, a 10 to 1 HF etchant solution yields approximately a 5 Å/second removal rate.

Figure 7:
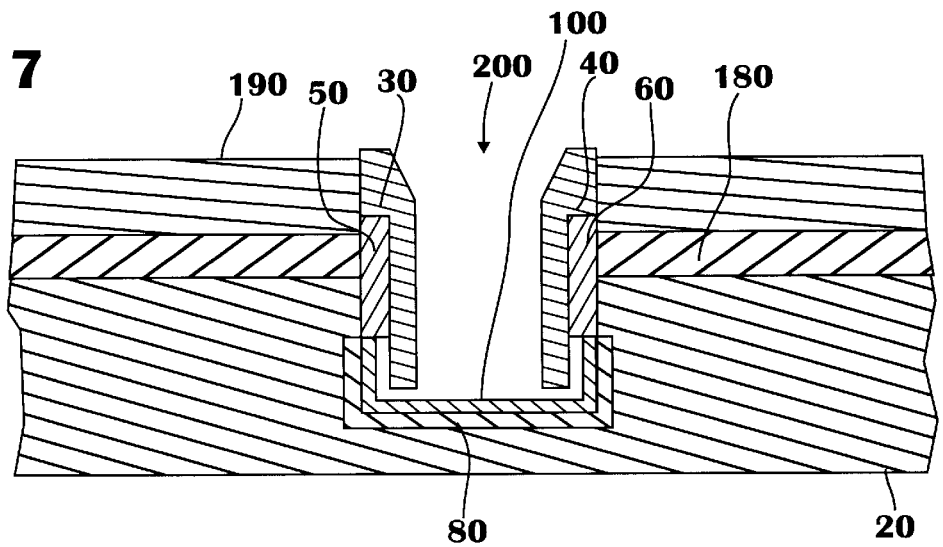
FIG. 7 is the cross-sectional view of FIG. 6 following formation of a source/drain region in the trench in accordance with the present invention.

Referring now to FIG. 7, the source/drain region 80 is established by diffusing a dopant specie of a first dopant type, e.g. n-type, into the portion of the substrate 20 exposed by the aforementioned etch step. In an exemplary embodiment, the substrate 20 is exposed to an arsenic bearing ambient in a RTA diffusion doping process at about 800 to 1100° C. for about 10 to 30 seconds. The arsenic may be introduced in the form of AsH$_3$, vaporized arsenic powder, or other arsenic bearing agent. The peak concentration of arsenic, as well as the overall doping profile, will be a matter of design discretion. In an exemplary embodiment a peak concentration of arsenic is advantageously about 10$^6$ atoms/cm$^3$. The diffusion process not only establishes the arsenic doping in the substrate 20, but also serves to dope and render conductive the gate electrodes 30 and 40. The doped RTA process yields a source/drain region 80 with a very shallow junction 149 (See FIG. 1).

It is desirable to protect the source/drain region 80 from later, and potentially damaging processing steps. In this regard, a thin oxide layer 100 of about 50 to 100 Å is formed over the source/drain region 80. The layer 100 may be grown by exposing the substrate 20 to an O$_2$ containing ambient at approximately 800 to 1050° C. for approximately 10 to 60 seconds in a rapid thermal anneal process ("RTA"), or for approximately 5 to 20 minutes in a diffusion tube process. CVD may also be used.

Figure 8:
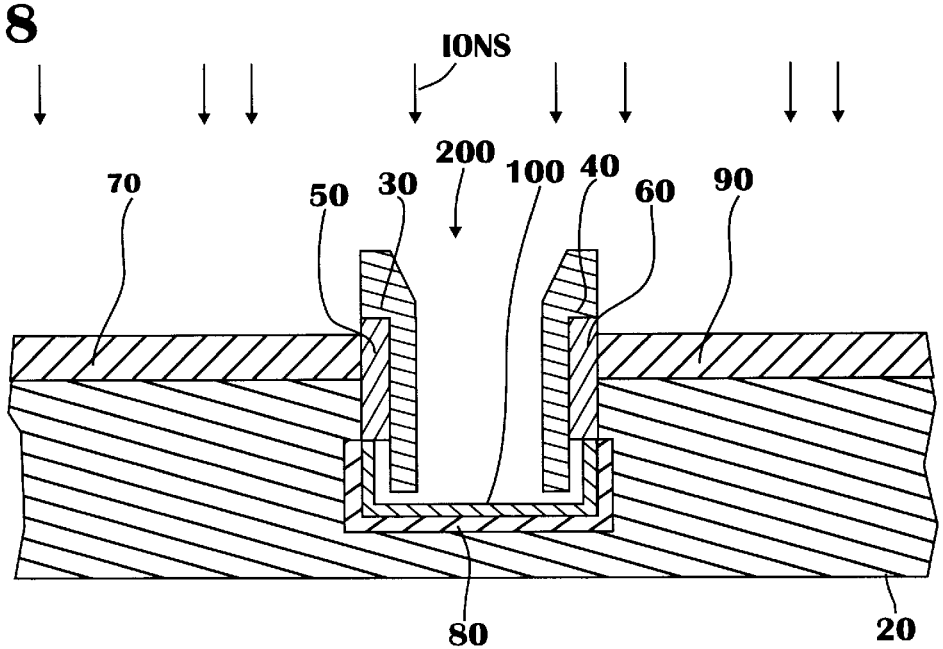
FIG. 8 is the cross-sectional view of FIG. 7 depicting formation of source/drain regions lateral to the gate electrodes in accordance with the present invention.

Referring now to FIG. 8, the nitride layer 190 shown in FIG. 7 is stripped away using well known nitride stripping techniques and the pad oxide layer 180 is etched by reactive ion or plasma etching. The thin oxide layer 100 protects the underlying source/drain region 80 during the nitride and pad oxide stripping steps. Following the nitride and pad oxide strips, the source/drain regions 70 and 90 are advantageously established by ion implantation. Prior to the implant, the gate electrodes 30 and 40 as well as the underlying source/drain region 80 are masked. In an exemplary embodiment, arsenic is implanted at about 5 to 20 keV and advantageously about 10 keV. The dosage may be about 2E15 to 7E15 ions/cm$^2$ and is advantageously 4E15 ions/cm$^2$. As with any of the aforementioned implants, these dosage and energy values will be proportionally different for different dopant species. The source/drain regions 70 and 90 may be activated by a RTA process at about 800 to 1100° C. for about 10 to 30 seconds.

Referring again to FIG. 1, the second insulating or passivation layer 110 may be applied over the transistor 10 following the implant to establish the source/drain regions 70 and 90 depicted in FIG. 8. The passivation layer 110 may be composed of tetra-ethyl-ortho-silicate ("TEOS"), spin-on-glass, BPSG, or other suitable interlevel dielectric materials, and is advantageously composed of TEOS deposited by CVD. The layer 150 may be 0.75 µm to 1.2 µm thick and is advantageously about 1.0 µm thick. Follow deposition, the layer 150 may be planarized to slightly above the tops of the gate electrodes 30 and 40 by chemical-mechanical-polishing ("CMP") or other planarization techniques. If desired, the thermal steps associated with application of the passivation layer 110 may also serve as the activating anneal for the source/drain regions 70 and 90.

As noted above, the minimum possible channel length in conventional processing is dependent on the maximum resolution of available photolithographic systems. In contrast, the process in accordance with the present invention yields a transistor with a minimum potential channel length that is not tied to the maximum resolution of currently available photolithographic systems. The gate electrode and the gate dielectric layers are flipped on end and predictable etching is employed to set the channel length. Accordingly, channel lengths of well below 0.1 µm are possible. Incorporation of a doped RTA diffusion process provides for a very shallow source/drain region to act in concert with the very short channel length.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of fabricating an integrated circuit transistor on a substrate, comprising the steps of:

forming a trench in the substrate, the trench having a sidewall;

forming a fist insulating layer on the sidewall;

forming a gate electrode on the first insulating layer, the gate electrode having a lower end;

forming a first source/drain region in the substrate above the lower end of the sate electrode; and forming a second source/drain region in the substrate whereby a first portion of the first source/drain region and a second portion of the second source/drain region are vertically spaced apart to define a channel region in the substrate and the second portion of the second source/drain region has a junction positioned substantially at or above the lower end of the gate electrode.

2. The method of claim 1, comprising the step of forming a second insulating layer on the first source/drain region.

3. The method of claim 1, comprising the steps of forming a third insulating layer on the substrate and a fourth insulating layer on the second insulating layer, the trench extending through the third and fourth insulating layers.

4. The method of claim 1, wherein the step of forming the first insulating layer comprises forming a layer of insulating material in the trench and removing a first portion of the layer of insulating material to expose a portion of the sidewall while leaving a second portion of the layer of insulating material between the gale electrode and the unexposed portion of the sidewall.

5. The method of claim 1, wherein the step of forming the gate electrode comprises forming a layer of doped polysilicon in the trench and thereafter removing a portion of the doped polysilicon from the trench while leaving a layer of doped polysilicon on the first insulating layer.

6. The method of claim 5, wherein the polysilicon is doped by diffusing a dopant specie of a first dopant type into the polysilicon.

7. The method of claim 1, wherein the first source/drain region is formed by diffusing a dopant specie of a first dopant type into the areas of the substrate exposed to the trench.

8. The method of claim 5, wherein the polysilicon is doped and the first source/drain region is formed by diffusing a dopant specie of a first dopant type into the polysilicon and into the areas of the substrate exposed to the trench.

9. The method of claim 1, comprising the step of forming a passivation layer over the transistor that fills the trench.

10. A method of fabricating all integrated circuit transistor on a substrate, comprising the steps of:

forming a trench in the substrate, the trench having a sidewall;

forming a first insulating layer in the trench, the first insulating layer coating the sidewall;

forming a gate electrode on the first insulating layer, the gate electrode having a lower end;

removing a first portion of the first insulating layer while leaving a second portion thereof between the gate electrode and the sidewall;

forming a first source/drain region in the substrate whereby the first source/drain region has a first portion disposed laterally in relation to the first insulating layer and has a junction positioned substantially at or above the lower end of the gate electrode; and forming a second source/drain region in the substrate above the lower end of the gate electrode whereby a first portion of the first source/drain region and a second portion of the second source/drain region are vertically spaced apart to define a channel region in the substrate.

11. The method of claim 10, comprising the step of forming a second insulating layer on the first source/drain region.

12. The method of claim 10, comprising the steps of forming a third insulating layer on the substrate and a fourth insulating layer on the second insulating layer, the trench extending through the third and fourth insulating layers.

13. The method of claim 10, wherein the step of forming the first insulating layer comprises forming a layer of insulating material in the trench and removing a first portion of the layer of insulating material to expose a portion of the sidewall while leaving a second portion of the layer of insulating material between the gate electrode and the unexposed portion of the sidewall.

14. The method of claim 10, wherein the step of forming the gate electrode comprises forming a layer of doped polysilicon in the trench and thereafter removing a portion of the doped polysilicon from the trench while leaving a layer of doped polysilicon on the first insulating layer.

15. The method of claim 14, wherein the polysilicon is doped by diffusing a dopant specie of a first dopant type into the polysilicon.

16. The method of claim 10, wherein the first source/drain region is formed by diffusing a dopant specie of a first dopant type into the areas of the substrate exposed to the trench.

17. The method of claim 14, wherein the polysilicon is doped and the first source/drain region is formed by diffusing a dopant specie of a first dopant type into the polysilicon and into the areas of the substrate exposed to the trench.

18. The method of claim 10, comprising the step of forming a passivation layer over the transistor that fills the trench.

19. An integrated circuit transistor, comprising:
a substrate having a trench formed therein that has a sidewall;
a gate dielectric layer coupled to the sidewall;
a first source/drain region in the substrate, the first source/drain region having a first portion thereof being laterally disposed in relation to the first insulating layer;
a second source/drain region in the substrate having an upwardly protecting portion with a junction, the upwardly projecting portion being vertically spaced from the first source/drain region to define a channel region lateral to the first insulating layer;
a gate electrode coupled to the gate dielectric layer and having a lower end positioned substantially at or below the junction, the gate electrode being spaced laterally from the first and second source/drain regions by the first insulating layer.

20. The integrated circuit transistor of claim 19, wherein the gate dielectric layer comprises silicon dioxide.

21. The integrated circuit transistor of claim 19, comprising a second insulating layer formed on the first source/drain region.

22. The integrated circuit transistor of claim 19, wherein the second insulating layer comprises silicon dioxide.

23. The integrated circuit of claim 19, wherein the gate electrode comprises doped polysilicon.

24. The integrated circuit transistor of claim 19, comprising a passivation layer filling the trench.

* * * * *

UNITED STATES PATENT AND TRADEMARK OFFICE
CERTIFICATE OF CORRECTION

PATENT NO.  : 6,091,105
DATED       : July 18, 2000
INVENTOR(S) : Mark I. Gardner et al.

It is certified that error appears in the above-identified patent and that said Letters Patent is hereby corrected as shown below:

Column 5, and column 6,
Lines 16 and 2, delete "↑" and substitute -- Å -- therefor;

Column 7,
Line 46, delete "Follow" and substitute -- Following the -- therefor;

Claim 1,
Line 13, delete the word "fist " and substiute the word -- first -- therefor;
Line 13, delete the word "sate" and substitute the word -- gate -- therefor;

Claim 4,
Line 37, delete the word "gale" and substitute the word -- gate -- therefor;

Claim 10,
Line 57, delete the word "all" and substitute the word -- an -- therefor; and Claim 19,
Delete the word "protecting" and substitute the word -- projecting -- therefor.

Signed and Sealed this

Twentieth Day of November, 2001

*Attest:*

*Attesting Officer*

NICHOLAS P. GODICI
*Acting Director of the United States Patent and Trademark Office*